(12) United States Patent
Mostov (10) Patent No.: US 6,175,727 B1
(45) Date of Patent: Jan. 16, 2001

(54) SUSPENDED PRINTED INDUCTOR AND LC-TYPE FILTER CONSTRUCTED THEREFROM

(75) Inventor: Alexander Mostov, Rishon Lezion (IL)

(73) Assignee: Texas Instruments Israel Ltd., Tikva (IL)

( * ) Notice: Under 35 U.S.C. 154(b), the term of this patent shall be extended for 0 days.

(21) Appl. No.: 09/004,777

(22) Filed: Jan. 9, 1998

(51) Int. Cl.$^7$ ........................................... H04B 1/00
(52) U.S. Cl. .................. 455/307; 336/180; 336/199; 336/200; 174/255; 174/265
(58) Field of Search ......................... 336/200, 199, 336/180; 174/255, 265; 455/307, 280, 281, 283, 285, 286, 290, 292

(56) References Cited

U.S. PATENT DOCUMENTS

| | | | |
|---|---|---|---|
| 3,947,934 | * 4/1976 | Olson | 29/25.42 |
| 4,201,965 | * 5/1980 | Onyshkevych | 336/180 |
| 5,373,112 | * 12/1994 | Kamimura et al. | 174/255 |
| 5,539,241 | 7/1996 | Abidi et al. . | |
| 5,777,277 | * 7/1998 | Inagawa | 174/265 |

* cited by examiner

Primary Examiner—Fan Tsang
Assistant Examiner—Simon Nguyen
(74) Attorney, Agent, or Firm—Darby & Darby; Howard Zaretsky, Esq.

(57) ABSTRACT

A novel inductor termed a suspended printed inductor (SPI) and an LC-type printed filter constructed using the suspended printed inductor is disclosed. The LC-type suspended printed filter is formed over any suitable substrate material, such as a dielectric substrate, with greatly reduced effects on filter performance due to the characteristics of the material. SPIs are characterized by the absence of a ground plane. A ground plane may physically still exist but it is located at a sufficient distance form the printed circuit board such that the distance can be considered virtual infinity from an RF circuit perspective. A number of different types of inductors can be fashioned as a suspended printed type inductor, including serpentine line inductors or transmission line inductors. The suspended printed inductor can be utilized to construct numerous types of filters such as low pass, high pass, band pass, band stop or any combination thereof. In each case, the filter can be used in semi-lumped networks together with other types of capacitors. In addition, the SPI can be used to realize a transformer by printing two spiral inductors on both sides of the printed circuit board. The SPI, being realized as a printed pattern on a PCB, provides a low cost, accurate, high Q replacement for its equivalent lumped inductor of high cost.

28 Claims, 9 Drawing Sheets

SUSPENDED PRINTED INDUCTOR AND LC-TYPE FILTER CONSTRUCTED THEREFROM

This is a continuation, of application Ser. No. 09/004,777, filed Jan. 9, 1998. The most recent of these prior applications is hereby incorporated herein by reference, in its entirety.

FIELD OF THE INVENTION

The present invention relates generally to printed filters and more particularly relates to LC-type printed circuit filters realized using suspended printed inductors which can be formed over any dielectric substrate.

BACKGROUND OF THE INVENTION

High frequency radio frequency (RF) communications are becoming more and more prevalent in the world today. Products touting wireless RF communication links are becoming increasingly popular among consumers. A multitude of new products including redesigned existing ones are being built with wireless RF links today. Most RF communication circuits employ some form of resonant circuitry in their transceivers. Due to the explosive consumer demand for products sporting wireless communication links there is a need for low cost, high accuracy and high reliability filters that are suitable for mass manufacture using conventional techniques.

RF filters are necessary circuits in transmitters and receivers that operate in a both wireless and non-wireless, i.e., cable, environments. In a transmitter, the amount of suppression that an RF filter must provide is determined by regulatory requirements or by the amount of interference that the transmitter might cause as a result of unwanted spectral components. RF filters are even more essential in receivers of communications systems especially when the communications system is wireless and is likely to suffer from reception of interfering signals in addition to the normal reception noise. In a receiver, the quality of the filtering dramatically effects the reception performance, especially when considering certain types of interference. A particular receiver may deliver a much lower output quality (i.e., higher error rate in a digital receiver, or large signal distortions in an analog receiver) if the frequency response of its filters is compromised.

When defining the filtering requirements in a receiver, the following factors should be considered: (1) the frequency band in which the receiver is to operate, (2) the frequency conversions and IF to be used, (3) the spectrum of the modulated signal to be demodulated by the receiver and (4) the nature of any interfering signals to be encountered and the associated rejection requirements.

The filter preceding the demodulator is normally the narrowest and should allow a minimum amount of additive noise and interference to enter the demodulator. Its bandwidth is normally close to that of the modulated signal for which the receiver was designed. The selectivity of the receiver, i.e., the rejection of adjacent frequencies which may cause jamming or performance degradation, is determined by the steepness of the frequency response curve of this filter.

In a single frequency receiver, such as in the case of pagers, the narrow filter may precede most of the electronic circuitry of the receiver, thus reducing the possibility of intermodulation products being generated within the receiver. In receivers intended for an entire band of frequencies, from which one frequency among many is in use at any one time, the filtering at the input of the receiver usually has a bandwidth at least as wide as that of the entire band used. These filters cannot provide rejection for in band interference and usually do not have significant attenuation even for out of band frequencies which are close to the edges of the band. In such receivers, the IF filtering provides effective rejection of such interference as long as inband intermodulation products are not generated before the signal is filtered by the narrow IF filtering.

The wide filters located at the input to the receiver are intended to provide image rejection and out of band interference rejection, which is effective for signals sufficiently far from the edges of the frequency band. A typical filter, e.g., surface acoustic wave (SAW) filter, for use in the 900 MHz ISM band, for example, costs over $1.50 and has a frequency response with limited out of band attenuation.

Most RF filters and circuits for communication applications make use of one or more inductors in their design. Previously, these were lumped inductors or printed inductors which have been formed on printed circuit boards using a variety of techniques such as stripline, microstrip, slotline, etc. Inductors formed using any of these techniques are typically constructed in the form of a planar spiral with the spiral being circular or square in shape. A disadvantage, however, of forming inductors, such as microstrip inductors, on printed circuit boards is that they are very sensitive to the characteristics of the printed circuit board material. The characteristics of the printed circuit board material directly affect the characteristics and performance of the inductors formed thereon. Parameters of the PCB material such as thickness and dielectric constant affect the characteristics of the inductor. The sensitivities of microstrip inductors to the dielectric constant of the printed circuit board material causes variations in the resultant self resonant frequency. In addition, variations in the thickness of the PCB material causes variations in the value of the inductance which results in frequency response errors of any filter constructed therefrom.

Another disadvantage of constructing printed inductors on printed circuit boards using traditional techniques is that the repeatability of the value of the inductance is very low. As described above, the characteristics of the inductor are very sensitive to the parameters of the printed circuit board material. In addition, most printed circuit inductors constructed utilizing conventional techniques have limited values of the quality factor Q of the inductor. This is due to the nature of the conventional inductor which is constructed having a ground plane. Further, since the ground plane is separated from the printed inductor traces by the printed circuit board material there is typically significant parasitic capacitance between the inductor and the underlying ground plane. In some applications, this parasitic capacitance can be problematic because it causes a reduction in the self resonant frequency of any LC combination formed using the inductor.

An alternative to using printed circuit inductors, such as microstrip and stripline inductors, is to use discrete inductor elements. A disadvantage, however, of using discrete elements is the high cost typically associated with high Q lumped coils.

An inductor constructed on a semiconductor substrate is known in the prior art. U.S. Pat. No. 5,539,241, issued to Abidi et al., discloses an integrated circuit having a monolithic passive component such as an inductor which is constructed so as to be suspended over a pit in the substrate. Suspending the inductor over a pit serves to reduce parasitic capacitance and enhance the performance of the inductor.

SUMMARY OF THE INVENTION

A lower cost alternative to the SAW filter discussed in the Background of the Invention section above is a filter based on a few coupled LC-type resonators. In order to achieve reasonable performance and production yield in such a filter, the capacitors and coils must be of a high accuracy and quality factor Q which might add up to considerable cost depending on the order of the filter. A solution for this is provided by the present invention in which printed elements on the PCB form high Q coils and eliminate the need for lumped coils having a high accuracy, high quality factor Q and high cost. The coils of the present invention are constructed in such a manner so as to eliminate the dependency upon the dielectric constant of the PCB substrate material. In addition, the dependency on other parameters of the PCB material such as its thickness are also eliminated. Consequently, a reliable and accurate filter can be constructed at a very low cost having the requisite performance and yield.

The present invention discloses a novel inductor termed a suspended printed inductor (SPI) by the inventors. In addition, the invention also includes an LC-type suspended stripline filter (also known as an LC-type printed filter) constructed using the suspended printed inductor. The LC-type suspended printed filter can be formed over any suitable substrate material, such as a dielectric substrate, with greatly reduced effects on filter performance due to the characteristics of the material. Filters constructed utilizing the suspended printed filter are able to achieve performance similar to that of air cavity filters.

The basic element of the printed filter of the present invention is the suspended printed inductor (SPI). A characteristic feature of a SPI is that its ground plane is effectively removed. The ground plane may physically still exist, e.g., a metal shield surrounding the circuit board, but it is placed at a sufficient distance form the printed circuit board such that the distance can be considered virtual infinity from an RF perspective.

A number of different types of inductors can be fashioned as a suspended printed type inductor, including but not limited to a spiral inductor, serpentine line inductor or a transmission line inductor. A unique characteristic of SPIs is that its ground plane is located at a greater distance than compared with the ground plane distances typically found in inductors constructed utilizing standard microstrip or stripline techniques.

The suspended printed inductor can be utilized to construct numerous types of filters such as low pass, high pass, band pass, band stop or any combination thereof. In each case, the filter can be used in lumped or semi-lumped networks together with different types of capacitors such as SMD ceramic, thin film printed or interdigital printed capacitors. In addition, the SPI can be used to realize a transformer by printing two spiral inductors on both sides of the printed circuit board.

The suspended printed inductor has many advantages which are briefly outlined below. Firstly, a suspended printed inductor has a high quality factor Q even when constructed using low cost printed circuit board (PCB) materials. A quality factor Q can be achieved that is up to ten times that of a microstrip inductor implemented on the same material.

Secondly, suspended printed inductors have improved repeatability of the inductance value. Since there is no ground plane under the printed inductor, sensitivities to PCB material characteristics such as thickness and dielectric constant, are eliminated. The variation of the inductance value of an SPI, i.e., the tolerance, due to the ground plane distance can be reduced to less than 1%, which helps to eliminate the need for trimming or tuning during production.

Thirdly, the self resonant frequency of a suspended printed inductor is typically much higher than that of a comparable microstrip inductor. This is due to the low parasitic capacitance of suspended printed inductors. A low parasitic capacitance is achieved by increasing the distance to the ground plane or by removing it altogether, which functions to reduce the effective dielectric constant value of the inductor. This permits higher inductance values to be achieved while maintaining a safe frequency distance from the self resonant frequency of the inductor.

Fourthly, suspended printed inductors are cheaper to manufacture when compared to the use of lumped elements. SPI's serve to eliminate the high costs of high Q lumped coils by replacing them with printed patterns of negligible cost on a printed circuit board.

There is therefore provided in accordance with the present invention a suspended printed inductor, comprising a substrate onto which circuit elements can be printed, an electrically conductive trace printed onto the substrate, the electrically conductive trace shaped so as to form an inductor at the frequencies of interest and wherein an area of the substrate underlying the electrically conductive trace that is devoid of ground, power or signal trances.

The substrate may comprise standard printed circuit board or ceramic material. The printed circuit board material can comprise FR4 material. The electrically conductive material can comprise copper, aluminum or an alloy thereof. The printed inductor can have the shape of a rectangular spiral, polygon spiral, circular spiral, serpentine shape or elongated straight trace so as to form a transmission line suspended inductor.

The suspended printed inductor further comprises a pair of metallic covers positioned to sandwich the suspended printed inductor, the pair of metallic covers electrically connected to ground potential and functioning to shield the suspended printed inductor from external electromagnetic radiation, each metallic cover located at a distance from the suspended printed inductor sufficiently large to be considered virtual infinity. Further, the electrically conductive trace is on the order of 0.5 mm wide and the pair of metallic covers are located at least 3 mm from the printed inductor.

There is also provided in accordance with the present invention a radio frequency (RF) filter having an input and an output, the filter for filtering an input signal and generating an output signal therefrom, the filter comprising a substrate onto which circuit elements can be printed, N poles wherein at least one pole comprises at least one suspended printed inductor and wherein N is a positive integer greater than or equal to one, pole coupling means for electrically coupling the one pole to another in daisy chain fashion, input coupling means coupling the input signal to the $1^{st}$ pole and output coupling means coupling the $N^{th}$ pole to the output thus forming the output signal.

In addition, there is provided in accordance with the present invention a method of fabricating a suspended printed inductor, the method comprising the steps of providing a substrate onto which circuit elements can be printed, printing onto the substrate, an electrically conductive trace using standard lithographic techniques such that the electrically conductive trace functions as an inductor at the RF frequencies of interest and creating an area on the substrate under the printed electrically conductive trace that is devoid of ground, power of signal trances.

BRIEF DESCRIPTION OF THE DRAWINGS

The invention is herein described, by way of example only, with reference to the accompanying drawings, wherein.

DETAILED DESCRIPTION OF THE INVENTION

Figure 1:
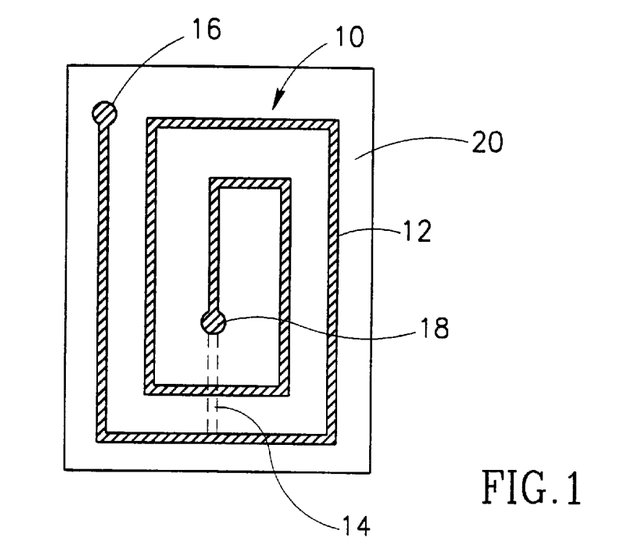
FIG. 1 is a diagram illustrating the top view of a suspended printed inductor constructed in accordance with the present invention.

A diagram illustrating the top view of a suspended printed inductor constructed in accordance with the present invention is shown in FIG. 1. The suspended printed inductor (SPI), generally referenced 10, is an inductor that is formed by printing an electrical conductive trace on an insulating material such as a printed circuit board (PCB) in similar fashion to a microstrip inductor with the exception that the SPI inductor does not have a ground plane or its ground plane is located at a distance large enough to be considered virtual infinity. The SPI 10 comprises an electrically conductive trace 12 formed on one layer of a substrate material 20, which in this example is a printed circuit board. The electrically conductive trace can comprise any suitable conductor such as copper, aluminum or alloys thereof. Terminals 16, 18 form the two terminals of the SPI 10. Trace 14, indicated in FIG. 1 as a dashed line, is located on the opposite side of the printed circuit board 20 from the side that inductor trace 12 is printed on. Terminal 18 can be connected to trace 14 by a via hole. To form the SPI 10, the side of PCB 20 opposite that of trace 12 is devoid of a ground plane. Only a relatively narrow signal trace 14 is placed on the other side of the PCB. The elimination of the ground plane is in direct contrast to the conventional microstrip inductor which is constructed with a ground plane on one side of the PCB.

The example suspended printed inductor 10 shown in FIG. 1 is fashioned as a rectangular spiral. It is noted that a rectangular spiral SPI is shown only for illustration purposes. Suspended printed inductors having other shapes are also realizable as described hereinbelow.

As described above, the main characteristic of the suspended printed inductor of the present invention is that the ground plane has been either completely eliminated or has been relocated to a distance that can be considered virtual infinity, which is a distance greater than that compared with the distance typically found in microstrip inductors.

Figure 2:
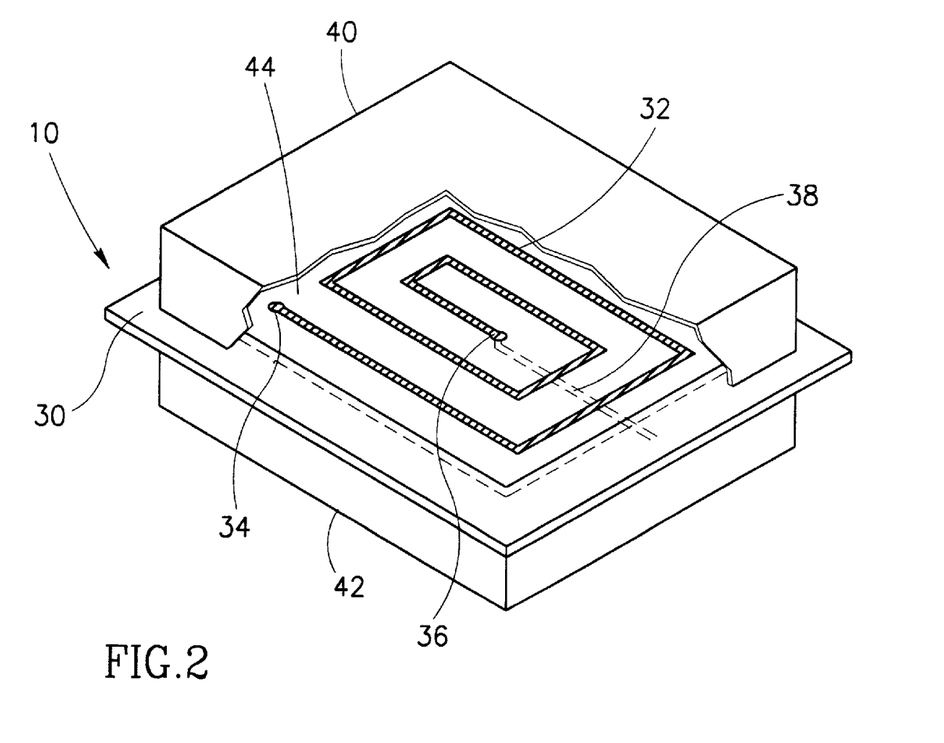
FIG. 2 is a diagram illustrating a perspective view of a suspended printed inductor constructed in accordance with the present invention and showing an upper and a lower grounded metal case for shielding the inductor circuit.

A diagram illustrating a prospective view of a suspended printed inductor constructed in accordance with the present invention and showing an upper and a lower grounded metal case for shielding the inductor circuit is shown in FIG. 2. The suspended printed inductor 10 is shown comprising a printed circuit board 30 having an upper and a lower surface. For illustration purposes only, a rectangularly shaped spiral trace 32 is shown on the upper surface of printed circuit board 30. Terminal 34 is located at one end of the inductor and terminal 36 at the other end. Terminal 36 is connected to a narrow signal trace 38 located on the lower layer of PC board 30 by way of a via (through hole).

The substrate, i.e.. printed circuit board 30, provides support for the suspended printed inductor and can comprise any substrate material having suitable physical and electrical characteristics, e.g., standard printed circuit board material such as FR4. A rectangular spiral inductor trace 32 is printed on the printed circuit board material 30. The inductor trace 32 is printed on one side., i.e. the upper side, of the printed circuit board 30 using standard lithographic techniques that are well known in the art. The opposite side or lower side of the printed circuit board 30 does not have a ground plane beneath the inductor trace 32. In operation, annular ground planes surround the rectangular spiral inductor on both sides of the printed circuit board 30.

Although optional, the suspended printed inductor is shown in FIG. 2 with two thin low cost metallic covers 40, 42. The two metallic covers 40, 42 are mounted on each side of the printed circuit board 30 and are electrically connected to ground potential. The metallic covers provide effective shielding for the circuitry containing the suspended printed inductor. The ground planes on the printed circuit board are interconnected by via holes. The two metallic covers 40, 42 form the ground planes for the suspended printed inductor which may be used to construct filters or other types of circuitry.

In the example shown here, the two metallic covers 40, 42 are constructed such that the ground planes formed by the two covers are located at a typical distance of approximately 5 mm each from the printed circuit board 30. As is well known in the art of RF circuit design, a ground plane can be considered to be at a distance of virtual infinity for purpose of circuit analysis when it is located at a distance greater than approximately ten times the width of the signal trace. In addition, the relative dielectric constant for the space between the printed trace 32 and the ground planes 40, 42 is equal to 1, i.e., the relative dielectric constant of air. This serves to increase the quality factor Q of the inductor. This, in turn, reduces the insertion loss of a filter constructed using such an inductor. Further, the production yield of a circuit such as a filter that utilizes the suspended printed inductor is greatly increased. This is in comparison with the case where the printed circuit board material itself, e.g., FR4, must be considered. In addition, the structure of any circuit utilizing a suspended printed inductor is more reliable and its electrical parameters are more repeatable.

The suspended printed inductor of the present invention can be used to form printed filters, with the SPI being a basic element of the filter. The SPI itself can be any type of printed inductor, e.g., spiral inductor, serpentine line inductor or a transmission line inductor, having a ground plane located at a distance of virtual infinity, which is a distance significantly greater than that typically found in microstrip filters. In addition, the suspended printed inductor can be implemented in various types of filters, for example, band pass, high pass, low pass, band stop or any combination thereof. Further, the filters can be constructed using the suspended printed inductor in semi lumped networks together with different types of capacitors, for example, SMD ceramic, thin film, printed MIM or interdigital printed capacitors. In addition, the suspended printed inductor can be utilized to realize a transformer by printing two spiral inductors on both sides of a printed circuit board, described in more detail hereinbelow.

The main advantage of the suspended printed inductor is that it can be used to realize filters having a high quality factor Q even when low cost printed circuit board materials are used. As described above, the metal covers 40, 42 which form the ground planes of the SPI are located a relatively large distance away from the printed circuit board 30 when compared with the distances typically found between microstrip elements and their respective ground planes. Increasing the distance between the ground plane and the inductor serves to dramatically increase the quality factor Q of the inductor. This is true up to a certain point after which the ground plane is effectively at virtual infinity. The suspended printed inductor can be implemented on readily available commercial printed circuit board material such as FR4 glass epoxy while achieving a quality factor Q up to ten times higher than that of a microstrip inductor implemented on the same material. This dramatic improvement in the quality factor Q is due to the improvement in the value of the loss tangent (tanδ), i.e., loss factor, of the media surrounding the inductor period. Considering the use of common FR4 printed circuit board materials, the loss factor for a suspended printed inductor is on the order of $10^{-6}$ as compared to 0.02 for a conventional microstrip inductor.

Suspended printed inductors also have the advantage of improved repeatability of the inductance value. Conventional microstrip inductors are typically very sensitive to the parameters of the material used to construct the printed circuit board. Standard commercial printed board material such as FR4 glass epoxy, have a tolerance of +/−10% in their thickness. In addition, the dielectric constant of the printed circuit board material varies. Thus, microstrip inductors constructed on PCBs are sensitive to both the thickness of the PCB and its dielectric constant. Commercial FR4 PCB material has a wide range of variation in its relative dielectric constant, which typically ranges between 4.5 and 5. This causes relatively large variations in the resultant self resonant frequency of the inductors since the self resonant frequency is strongly dependent upon the dielectric constant of the printed circuit board material. Considering frequencies on the order of the self resonant frequency, the variations in the relative dielectric constant ($\epsilon_r$) cause variations in the value of the inductor, which in turn, result in a filter having relatively large frequency response errors.

The problems described above do not occur with the suspended printed inductor where the ground plane under the inductor is eliminated, i.e., moved to a distance of virtual infinity. The ground plane under the inductor can be eliminated by cutting under the inductor in the printed circuit board ground plane and making an opening therein. When this is performed, the only structures to have an electromagnetic effect on the suspended printed inductor are the two optional shielding covers placed typically at a distance which is on the order of 5 mm away from the inductor. This is in contrast to the distance of the ground plane from a typical microstrip inductor which is on the order of 0.5 mm.

By increasing the distance of the ground planes an order of magnitude, the tolerance of the ground plane distance is improved to a value of less than 1%. This improves the repeatability of the value of the inductance and enables a much higher yield for filters based on suspended printed inductors.

The actual dielectric constant value for a suspended printed inductor is very close to 1 as is the case for air inductors. Since the dielectric constant for air is relatively constant, the repeatability of the inductance value is greatly improved with the subsequent increase in the production yield of filters constructed using the SPI.

Yet another advantage of suspended printed inductors is that the self resonant frequency is much higher than that of comparable microstrip inductors. The self resonant frequency of a suspended printed inductor is higher due to the lower parasitic capacitance of the SPI. The SPI is characterized by low parasitic capacitance due to the combination of a lower dielectric constant and a larger distance to the ground plane. This permits higher inductance values to be achieved with reasonable dimensions while remaining at a safe distance in frequency from the self resonant frequency.

Another advantage of suspended printed inductors is the low cost compared with lumped element inductors. Utilizing suspended printed inductors in filter circuits eliminates the high cost traditionally associated with high accuracy, high quality factor Q lumped coils. The relatively expensive high quality factor Q lumped coils are replaced with suspended printed inductors which comprise printed patterns on a printed circuit board which have high accuracy and negligible cost.

Figure 3:
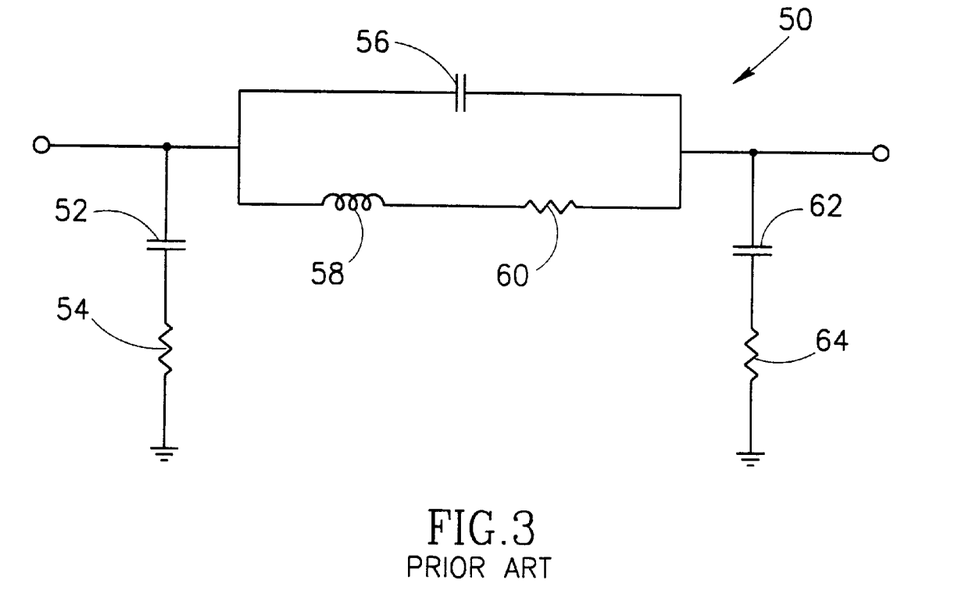
FIG. 3 is a schematic diagram illustrating the equivalent circuit for a prior art microstrip inductor having a ground plane.

A schematic diagram illustrating an equivalent circuit for a prior art microstrip inductor having a ground plane is shown in FIG. 3. The equivalent inductor circuit, generally referenced 50, comprises a capacitor 56 in parallel with the combination of an inductor 58 in series with a resistor 60. Inductor 58 represents the inductance of the microstrip inductor while resistor 60 is the series resistance resulting from the losses in the copper tracing. In addition, capacitor 56 represents the parasitic capacitance between the turns of the inductor.

The combination of capacitor 56, inductor 58 and resistor 60 is connected across two capacitors 52, 62 and two resistors 54, 64. Capacitors 52, 62 represent the capacitance between the turns of the inductor and the ground plane. Resistors 54, 64 represent the resistance due to the dielectric loss of the printed circuit board material. Note that if the dielectric loss of the printed circuit board material is relatively high (lossy) the resistance losses can be quite high.

Figure 4:
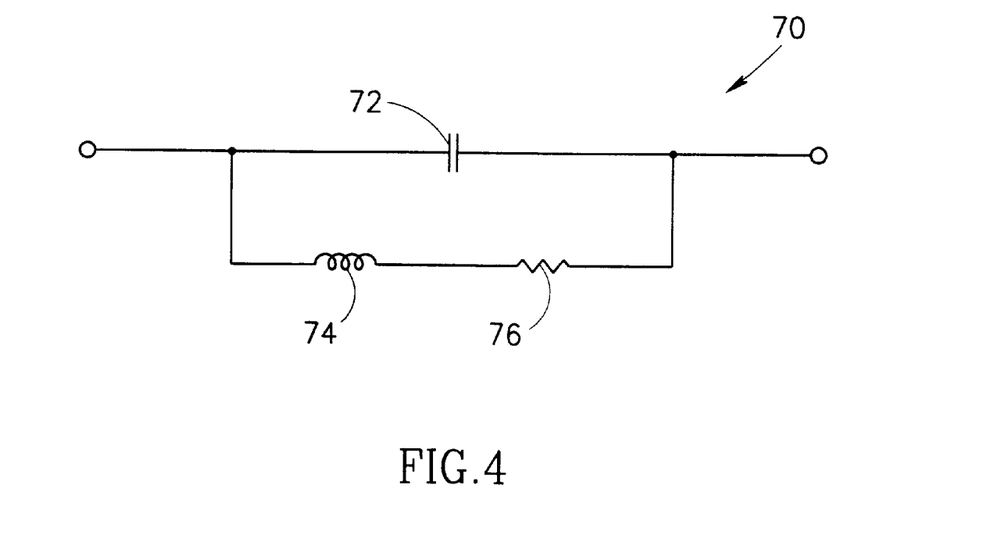
FIG. 4 is a schematic diagram illustrating the equivalent circuit for a suspended printed inductor of the present invention.

A schematic diagram illustrating the equivalent circuit for a suspended printed inductor of the present invention is shown in FIG. 4. In the circuit model shown in FIG. 4, the shunt elements capacitors 52, 62 and resistors 54, 64 are of negligible effect due to the ground plane being located at a distance of virtual infinity. The circuit model, generally referenced 70, comprises capacitor 72, inductor 74 and resistor 76. Due to the location of the ground plane at virtual infinity the shunt elements have been eliminated from the model and the suspended printed inductor can be modeled simply as a capacitor in parallel with the series combination of an inductor and a resistor. The resistance 76 represents the parasitic resistance of the inductor including the copper losses, thickness of the copper material and the skin effect of the surface of the copper trace.

Figure 5:
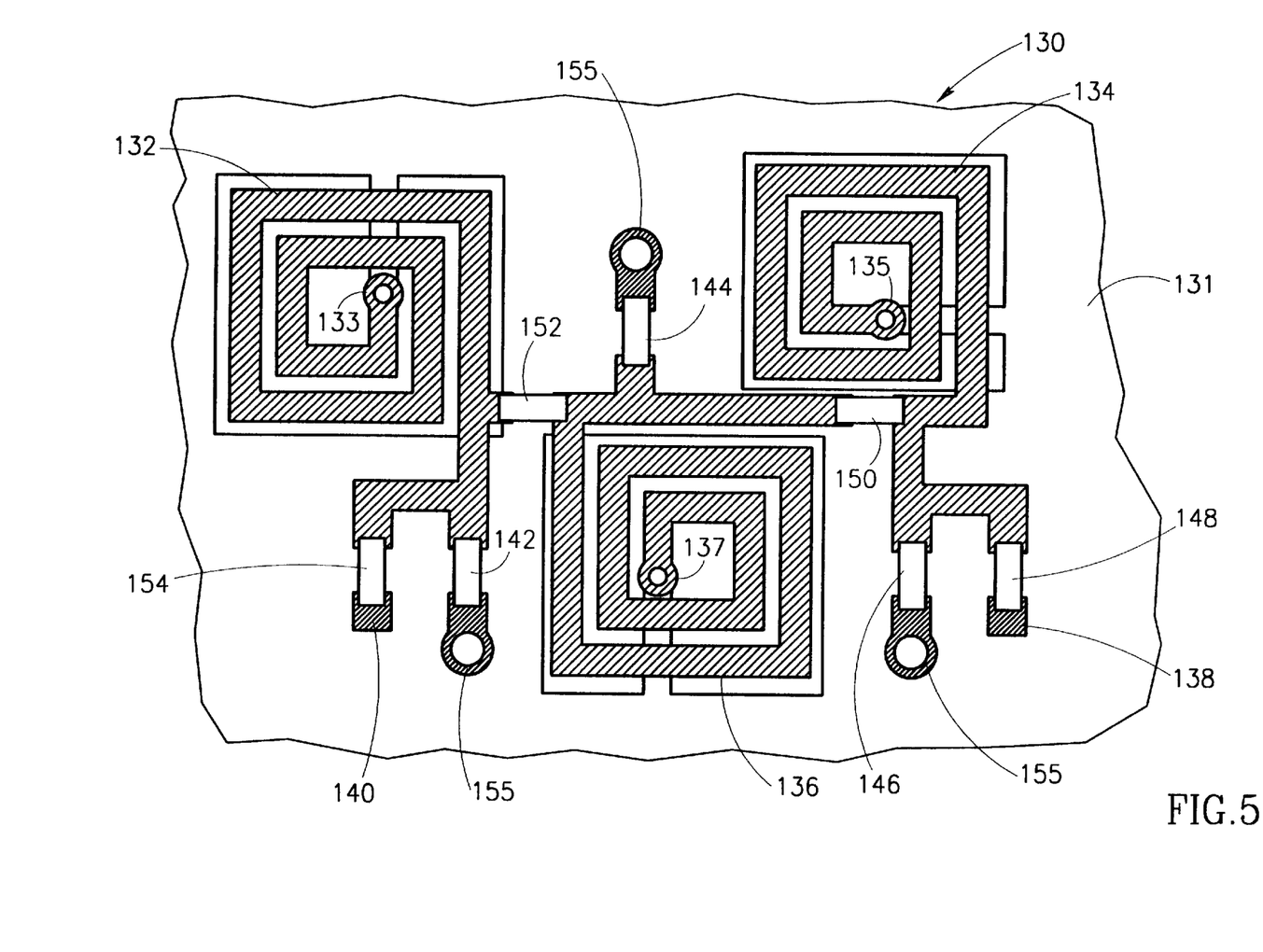
FIG. 5 is a diagram illustrating a printed circuit board (PCB) layout of a radio frequency (RF) filter constructed using the suspended printed inductor of the present invention.
Figure 6:
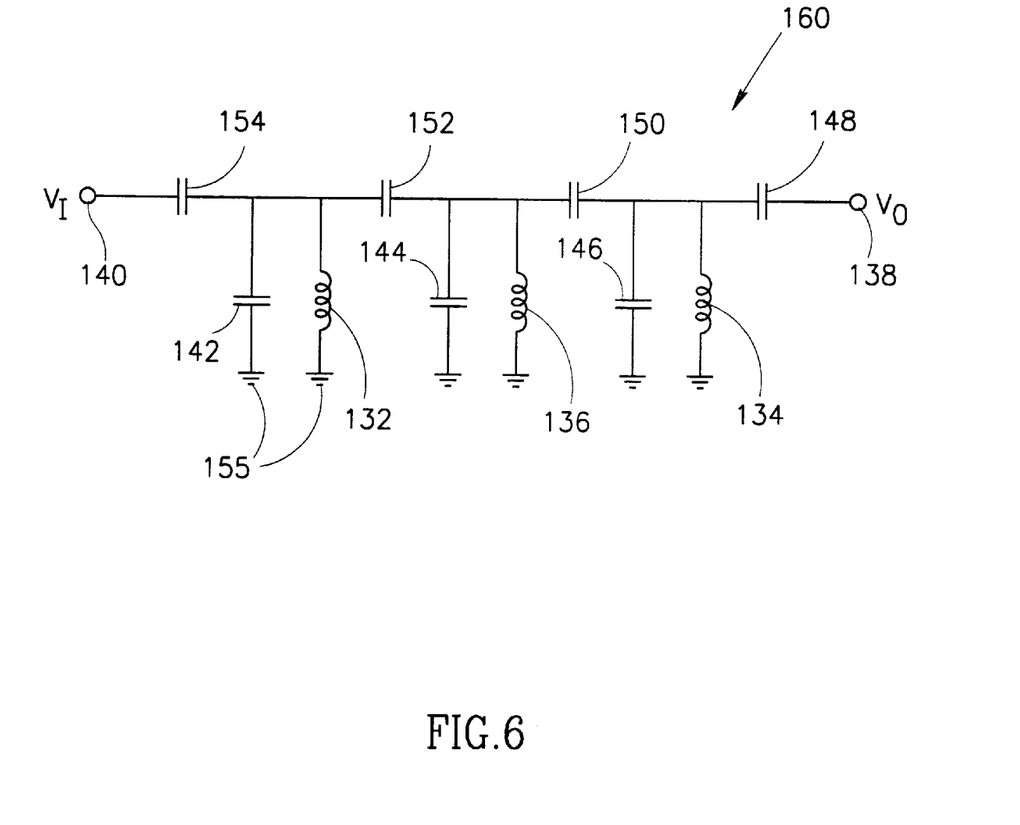
FIG. 6 is a schematic diagram illustrating the radio frequency (RF) filter circuit of FIG. 5.

A diagram illustrating a printed circuit board layout of an RF filter constructed using the suspended printed inductor of the present invention is shown in FIG. 5. A diagram presented hereinbelow in FIG. 6 shows the schematic of the RF filter of FIG. 5. The RF filter of FIGS. 5 and 6 is an LC type third order band pass filter constructed using three LC resonators coupled by standard SMD ceramic capacitors. With reference to FIG. 5, the circuit comprises suspended printed inductors 132, 134, 136 and capacitors 154, 142, 152, 144, 150, 146, 148. In addition, the circuit comprises ground plane 131, ground vias 133, 135, 137, 155 (shown as round pads). Terminal 140 serves as the input terminal for the input voltage $V_I$. Terminal 138 serves as the output terminal for output voltage $V_O$.

Each of the LC resonators comprises a suspended printed inductor in parallel with a capacitor. Each suspended printed inductor is resonated by a conventional capacitor such as a standard low cost SMD capacitor. Optionally, more than one capacitor may be used in each resonator to obtain non standard values of capacitance where each capacitor has a standard value. One of the capacitors used may be a tunable trimming capacitor which is useful to permit adjustments to be made at production time. In the example filter circuit shown in FIG. 5, a single fixed capacitor is used in constructing each resonator. The input coupling capacitor 154 and an output coupling capacitor 148 comprise conventional ceramic capacitors such as standard SMD ceramic capacitors. In addition, the filter including the suspended inductors are printed on low cost standard printed circuit board material such as FR4.

Also shown in FIG. 5 is the PCB layout for the ground plane portion 131 of the filter. In accordance with the present invention, the portion of the ground plane under the inductors is removed while the ground plane is present under the remainder of the circuit. Only a small signal trace is left connecting one terminal of the inductor to the ground via through holes 133, 135, 137.

In addition, shielding walls (not shown) can be added between each of the filter poles for reducing the self inductance of adjacent inductors. The shielding walls can be constructed using any suitable conductive material that can serve as RF shielding.

The typical specifications for the third order band pass filter of FIGS. 5 and 6 are listed below:
Center Frequency: 50 MHz to 2.5 GHz
Minimal Relative 3 dB Bandwidth: 3%
Maximum Insertion Loss at Center Frequency: 4 dB
Capacitor Tolerance: 2%
PCB Area Used: up to 15×12 mm
Estimated Cost: cost of PCB material plus seven 2% capacitors Note that a higher order filter might require trimming at the time of production, depending on the tolerance of the filter's elements. It is appreciated by those skilled in the RF filter art that this type of filter is ideal as a band pre-selector filter where it is responsible for rejecting out of band interference or as a first IF filter in a dual conversion receiver where the filter is responsible for rejecting inband interference. The second IF filter in such a receiver would usually be a standard ceramic filter having an extremely steep frequency response. Such a filter could perform noise limiting and would determine the selectivity of the receiver, i.e., adjacent channel rejection in a multi-channel environment.

Note that a filter based on the suspended printed inductor may be constructed to have a notch (band reject) within its response. This is useful in cases where interference is expected at certain known bands adjacent to the band of the filter, e.g., the interference from cellular telephones in the 800 to 900 MHz band to filters for the ISM band of 902 to 928 MHz. Using a filter with a notch further improves the overall performance of the receiver in comparison with one based on a simple band pass filter having limited out of band attenuation.

It is appreciated by those skilled in the RF filter arts that high pass and low pass sections can be added to the filter of FIG. 5, just as would be the case with conventional LC based filters. The only substantial consideration in such a design is the PCB area occupied by the filter and the cost of additional capacitors for the LC sections added.

A schematic diagram illustrating the RF filter circuit shown in FIG. 5 is shown in FIG. 6. The circuit of FIG. 6 is the equivalent circuit model of the LC type third order band pass filter shown in FIG. 5. The same reference numerals have been used so that components having the same reference numerals correspond to each other in both FIGS. 5 and 6.

Figure 7:
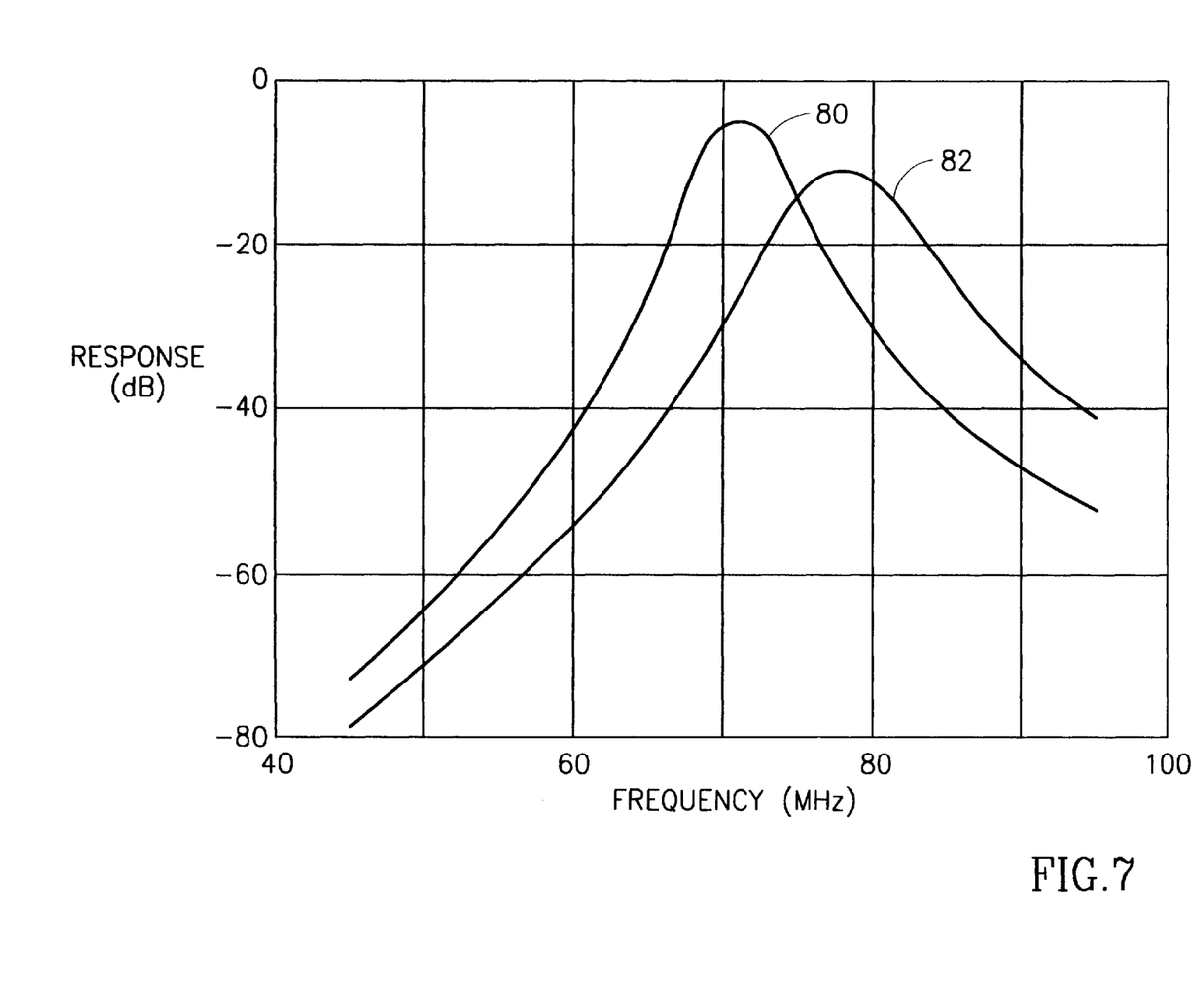
FIG. 7 is a graph comparing the performance of two band pass filters, one constructed using prior art microstrip inductors and the other constructed using suspended printed inductors of the present invention.

A graph comparing the performance of two band pass filters, one constructed using conventional microstrip inductors and the other constructed using suspended printed inductors of the present invention is shown in FIG. 7. Curve 80 is the response as a function of frequency of an SPI based band pass filter while curve 82 is the response as a function of frequency of a filter based on conventional microstrip inductors. Both curves 80 and 82 describe the S21 of the respective filters as a function of frequency. Note that the insertion loss of the band pass filter constructed using SPIs is 6 dB better than that of the band pass filter constructed using conventional microstrip inductors.

The improvement in the insertion loss for the band pass filter using SPIs is due to the higher quality factor Q associated with the SPI. As discussed previously, the higher quality factor Q was achieved by increasing the distance of the ground planes from the inductor itself. This enables the total length of the suspended printed inductor to be reduced by at least a factor of 2, thus reducing the area of the SPI by a factor of 4. Contributing also to the higher quality factor Q of the SPI is the decrease in the loss tangent of the insulating material situated between the printed inductor and its ground planes.

Curves 80 and 82 of FIG. 7 also illustrate a difference in the center frequencies of the two band pass filters. This difference in center frequencies arises from the fact that it is difficult to fix the inductance value of a microstrip inductor. Thus, these two curves further highlight the advantages of using SPI's to construct filters. In addition, curve 82 exhibits a wider bandwidth as compared with that of curve 80. This is due to the lower quality factor Q of the inductors used to construct the filter corresponding to curve 82.

Figure 8:
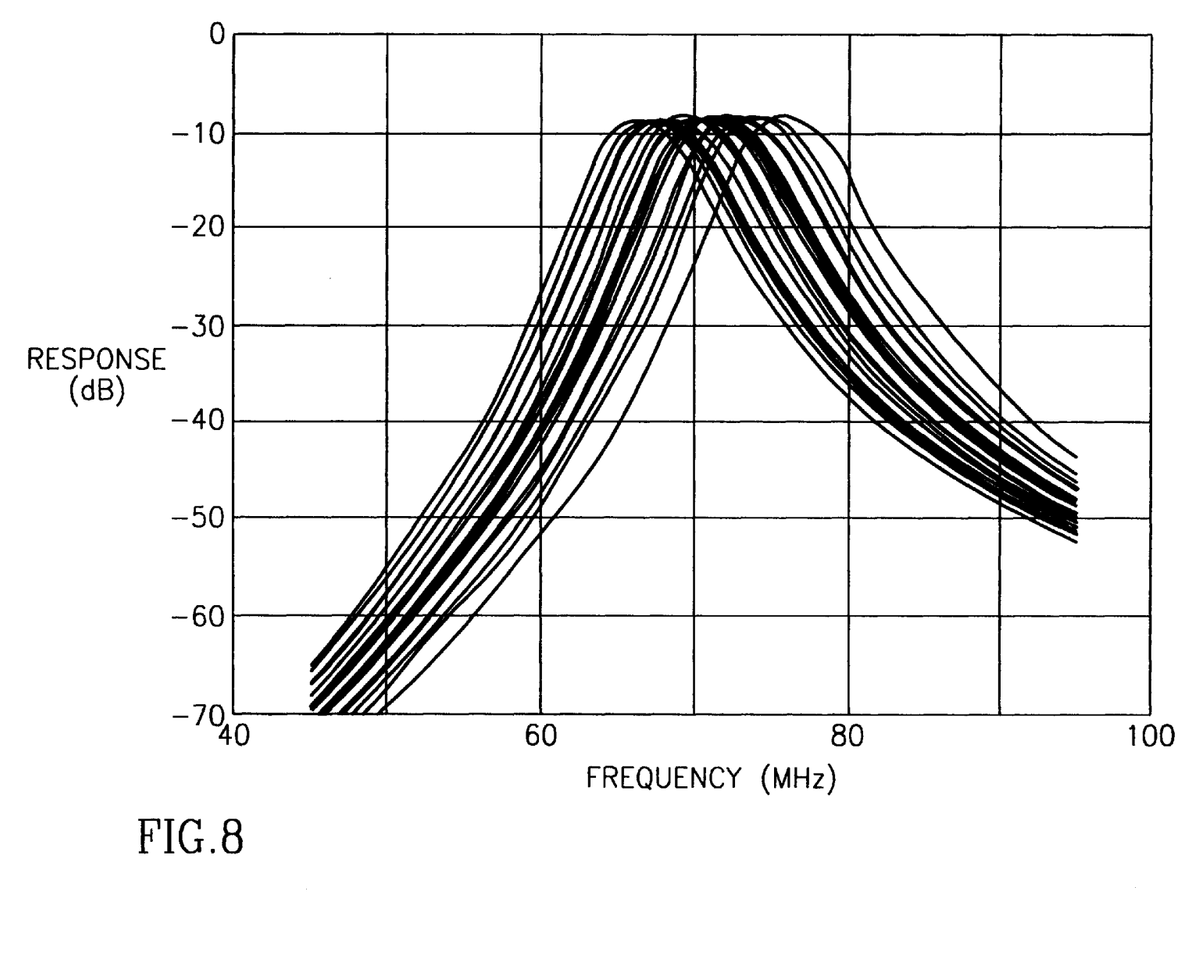
FIG. 8 is a graph illustrating the statistical spread of the frequency characteristics of band pass filters realized using prior art microstrip inductors.
Figure 9:
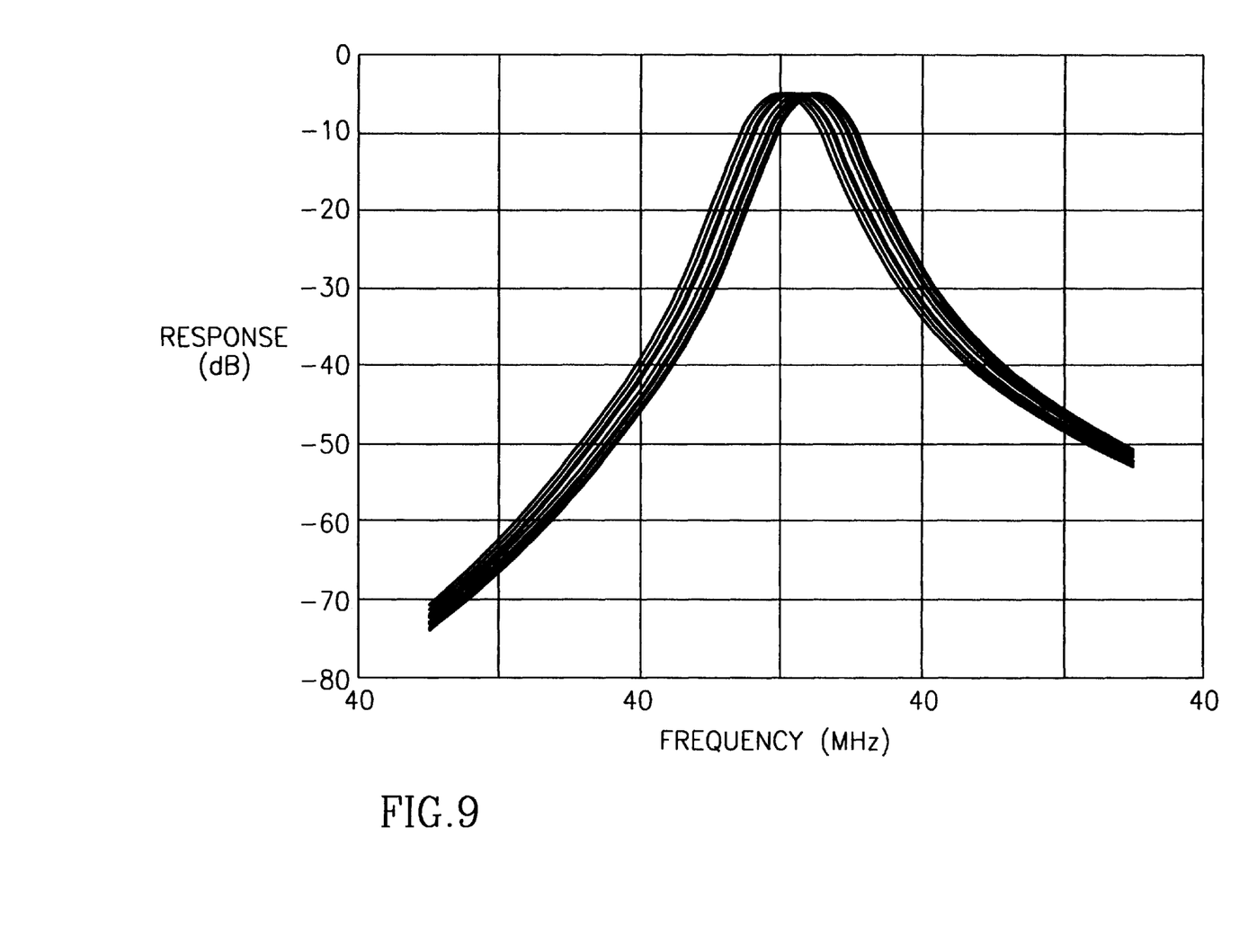
FIG. 9 is a graph illustrating the reduced statistical spread of the frequency characteristics of band pass filters realized using suspended printed inductors of the present invention.

A graph illustrating the statistical spread of the frequency characteristics of band pass filters realized using conventional microstrip inductors is shown in FIG. 8. A graph illustrating the statistical spread of the frequency characteristics of band pass filters realized using suspended printed inductors of the present invention is shown in FIG. 9. FIGS.

8 and 9 show the dramatic improvement achieved in the manufacturing yield when implementing the suspended printed inductor in the band pass filter of FIGS. 5 and 6, for example. For the same spread of parameters for the lumped components and PCB inductors, the statistical spread of the SPI based band pass filter (FIG. 9) is much lower than the statistical spread of an equivalent microstrip inductor based filter (FIG. 8). The large improvement in yield is due to ground planes of the suspended printed inductor being at an effectively infinitive distance from the inductor.

As previously mentioned, the suspended printed inductor of the present invention can be fashioned into numerous shapes. Diagrams illustrating the top views of alternatively shaped suspended printed inductors are shown in FIGS. 10A through 10D. In addition to the rectangular spiral inductor of FIG. 1, the following inductor shapes are also possible: The polygon spiral suspended printed inductor, generally referenced 90, of FIG. 10A comprises terminals 94, 95 and is constructed on printed circuit board material 98. The inductor 90 is comprised of a plurality of straight line segments 92 which are combined to form a polygon spiral. One end of the inductor 90, terminal 95, is electrically coupled to trace 96 (indicated by the dashed line) which is located on the opposite side of PCB 98.

Figure 10A:
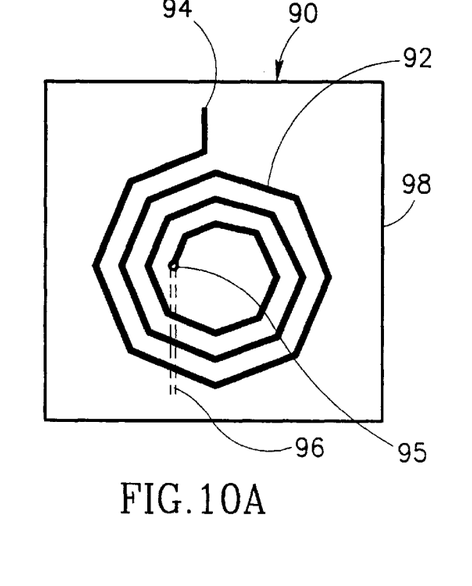
FIGS. 10A through 10D are diagrams illustrating the top views of alternative types of suspended printed inductors that can be formed.
Figure 10B:
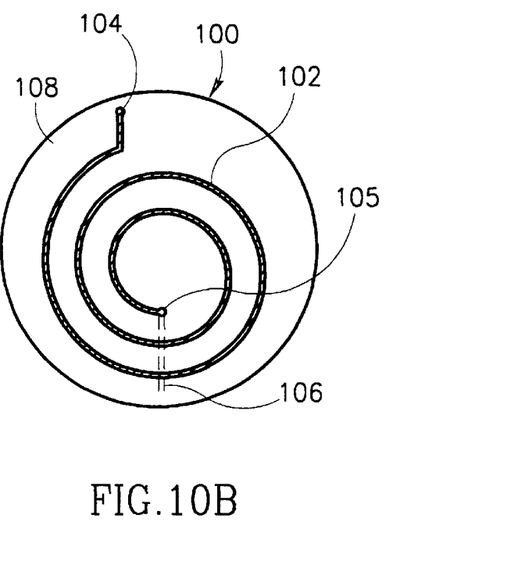

A circular spiral suspended printed inductor, generally referenced 100, is shown in FIG. 10B. The circular spiral SPI 100 comprises terminals 104, 105 and a spiraled trace 102. The inductor 100 is constructed on a conventional printed circuit board 108. One end of the inductor 100, terminal 105, is electrically coupled to a narrow signal trace 106 by a via on the opposite side of the printed circuit board 108.

Figure 10C:
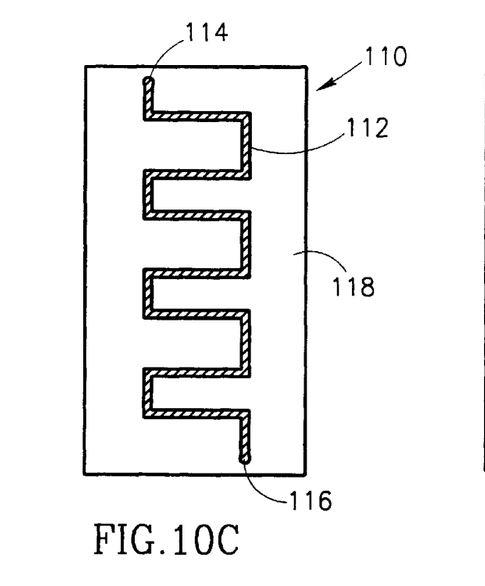

A serpentine suspended printed inductor, generally referenced 110, is shown in FIG. 10C. The inductor 110 comprises terminals 114, 116 and a serpentine shaped trace 112. The inductor 110 is constructed on standard printed circuit board material 118.

Figure 10D:
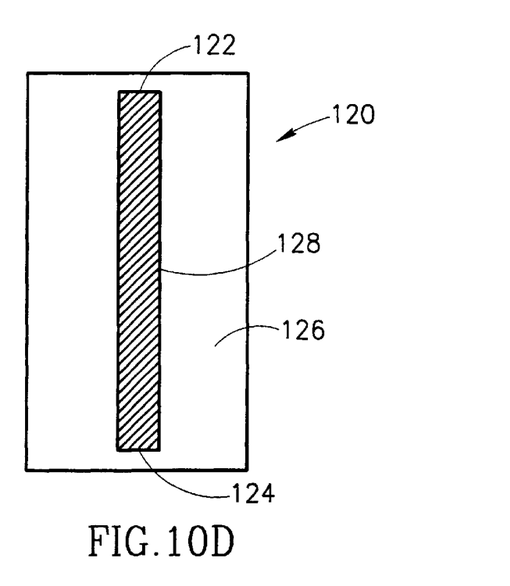

A transmission line suspended printed inductor, generally referenced 120, is shown in FIG. 10D. The inductor 120 comprises terminals 122, 124 and a substantially elongated straight single trace 128. The inductor 120 is constructed on standard printed circuit board material 126. Since the ground plane underneath inductor 120 has been eliminated, the inductor can be considered a suspended printed line having a distributed inductance at high frequencies. Note that the structure in FIG. 10D cannot be considered a microstrip since the underline ground plane has been eliminated.

Figure 11:
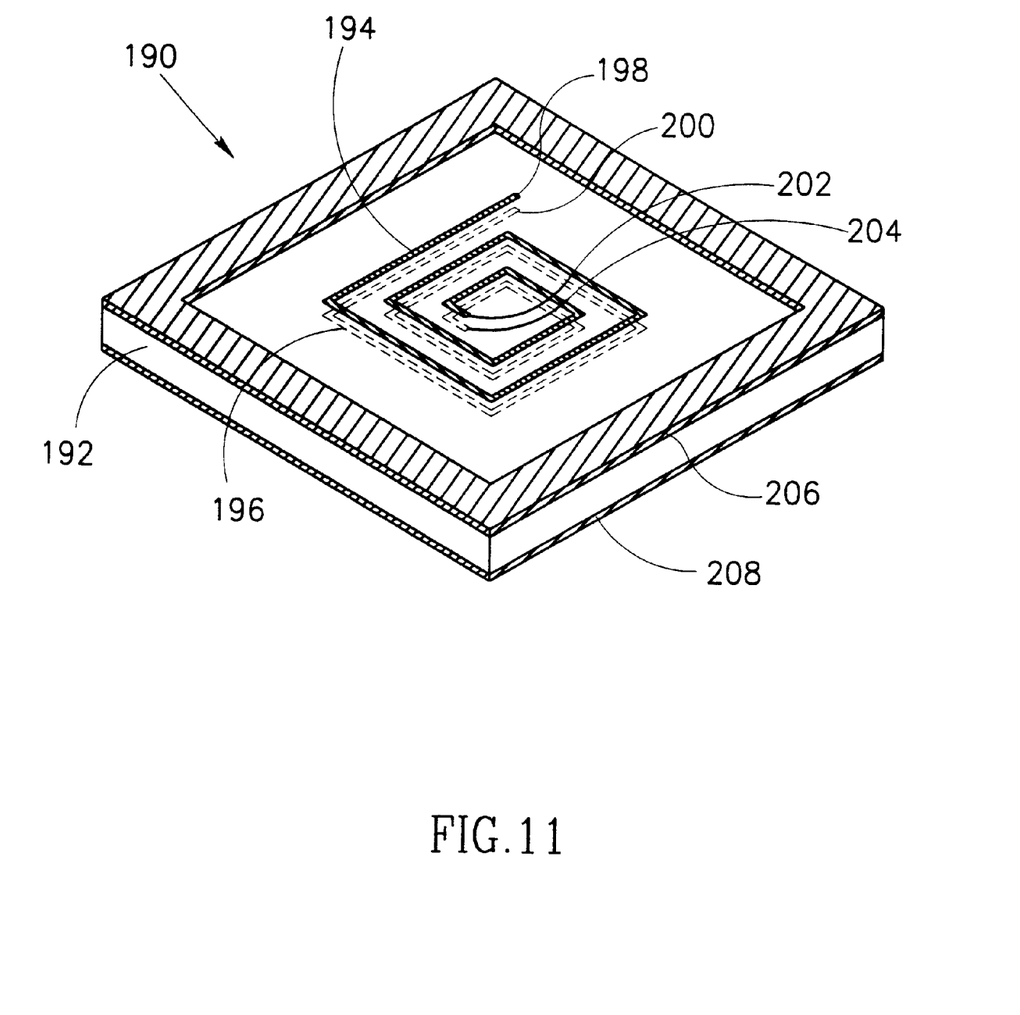
FIG. 11 is a diagram illustrating a perspective plan view of a printed transformer realized using two parallel suspended printed inductors of the present invention.

A diagram illustrating a prospective plan view of a transformer realized using two parallel suspended printed inductors of the present invention is shown in FIG. 11. The suspended printed transformer, generally referenced 190, is constructed on standard printed circuit board material 192 having an upper surface and a lower surface. On one of the surfaces, the upper surface for example, a suspended printed inductor is printed on the printed circuit board 192. In similar fashion, a second suspended printed inductor is printed on the opposite side, i.e., the lower surface, of the printed circuit board 192. The suspended printed inductors used to form the transformer can have any shape, including any of the shapes described above. In this example, the transformer is constructed utilizing the rectangularly shaped suspended printed inductors shown in FIGS. 1 and 2.

The upper suspended printed inductor 194 comprises two terminals 198, 202. Similarly, the suspended printed inductor 196 printed on the lower side of the printed circuit board comprises two terminals 200, 204. In addition, two annular ground planes 206, 208 are printed one on each side of the printed circuit board 192. The transformer is realized by the mutual coupling between the two suspended printed inductors. Note that the two suspended printed inductors may be printed either on the same side of the printed circuit board or on different layers, in which case the transformer would take up a smaller area.

Note that in order to realize a transformer having very tight coupling between the two inductors, the two suspended printed inductors should substantially be mirror images of each other being aligned one directly on top of the other. The small distance located between the two SPIs helps to achieve the tight coupling needed in order to realize a transformer.

On the other hand, loose or weak coupling is desirable for the construction of narrow band filters. In this case, the two suspended printed inductors should be skewed from one another. The increased distance between the inductors creates the loose coupling between them.

Note that when the two printed circuit inductors 194, 196 are printed on either side of a printed circuit board, at least one additional layer to the printed circuit board 192 is required in order to connect to terminals 202, 204 which are located in the inner portion of the rectangular spiral.

While the invention has been described with respect to a limited number of embodiments, it will be appreciated that many variations, modifications and other applications of the invention may be made.

What is claimed is:

1. A suspended printed inductor, comprising:
    a substrate onto which circuit elements can be printed;
    an electrically conductive trace printed onto said substrate, said electrically conductive trace shaped so as to form an inductor at the high radio frequencies of interest; and
    wherein an area of said substrate underlying said electrically conductive trace is devoid of electrical traces including power, ground and signal traces.

2. The suspended printed inductor according to claim 1, wherein said substrate comprises printed standard circuit board material.

3. The suspended printed inductor according to claim 1, wherein said substrate comprises ceramic.

4. The suspended printed inductor according to claim 1, wherein said electrically conductive trace comprises copper or an alloy thereof.

5. The suspended printed inductor according to claim 1, wherein said electrically conductive trace comprises aluminum or an alloy thereof.

6. The suspended printed inductor according to claim 1, wherein said printed inductor having the shape of a rectangular spiral.

7. The suspended printed inductor according to claim 1, wherein said printed inductor having the shape of a polygon spiral.

8. The suspended printed inductor according to claim 1, wherein said printed inductor having the shape of a circular spiral.

9. The suspended printed inductor according to claim 1, wherein said printed inductor having a serpentine shape.

10. The suspended printed inductor according to claim 1, wherein said printed inductor comprises an elongated straight trace so as to form a transmission line suspended inductor.

11. The suspended printed inductor according to claim 1, further comprising a pair of metallic covers positioned to sandwich said suspended printed inductor, said pair of metallic covers electrically connected to ground potential and functioning to shield said suspended printed inductor from external electromagnetic radiation, each metallic cover located at a distance from said suspended printed inductor sufficiently large to be considered virtual infinity.

12. The suspended printed inductor according to claim 11, wherein said electrically conductive trace is on the order of 0.5 mm wide and said pair of metallic covers are located at least 3 mm from said printed inductor.

13. A radio frequency (RF) filter having an input and an output, said filter for filtering an input signal and generating an output signal therefrom, said filter comprising:

- a substrate onto which circuit elements can be printed;
- N poles wherein at least one pole comprises at least one suspended printed inductor and wherein N is a positive integer greater than or equal to one, said suspended printed inductor comprising;
  - a substrate onto which circuit elements can be printed;
  - an electrically conductive trace printed onto said substrate, said electrically conductive trace shaped so as to form an inductor at the high radio frequencies of interest;
  - wherein an area of said substrate underlying said electrically conductive trace is devoid of electrical traces including power, ground and signal traces,
- pole coupling means for electrically coupling one pole to another in daisy chain fashion;
- input coupling means coupling said input signal to a $1^{st}$ pole; and
- output coupled means coupling a $N^{th}$ pole to said output thus forming said output signal.

14. The filter according to claim 13, wherein said substrate comprises printed standard circuit board material.

15. The filter according to claim 13, wherein said substrate comprises glass.

16. The filter according to claim 13, wherein said substrate comprises plastic.

17. The filter according to claim 13, wherein said substrate comprises ceramic.

18. The filter according to claim 13, wherein each pole comprises:

- an electrically conductive trace printed onto said substrate forming, said electrically conductive trace shaped so as to form an inductor at the frequencies of interest;
- wherein an area of said substrate underlying said electrically conductive trace is devoid of a ground plane thus forming said suspended printed inductor; and
- a capacitance means electrically coupled in parallel to said suspended printed inductor.

19. The filter according to claim 13, wherein said pole coupling means comprises a capacitance.

20. The filter according to claim 13, wherein said input coupling means comprises a capacitance.

21. The filter according to claim 13, wherein said output coupling means comprises a capacitance.

22. The filter according to claim 13, wherein said suspended printed inductor is substantially shaped as a rectangular spiral.

23. The filter according to claim 13, wherein said suspended printed inductor is substantially shaped as a polygon spiral.

24. The filter according to claim 13, wherein said suspended printed inductor is substantially shaped as a circular spiral.

25. The filter according to claim 13, wherein said suspended printed inductor has a substantially serpentine shape.

26. The filter according to claim 13, wherein said suspended printed inductor comprises an elongated straight trace so as to form a transmission line suspended inductor.

27. The filter according to claim 13, further comprising shielding walls between each of said N poles for reducing the self inductance of adjacent inductors.

28. A method of fabricating a suspended printed inductor, said method comprising the steps of:

- providing a substrate onto which circuit elements can be printed;
- printing onto said substrate, an electrically conductive trace printed using standard lithographic techniques such that said electrically conductive trace functions as an inductor at the RF frequencies of interest; and
- creating an area on said substrate underlying said printed electrically conductive trace that is devoid of electrical traces including power, ground and signal traces.

* * * * *